United States Patent
Augustino et al.

(10) Patent No.: US 10,153,136 B2
(45) Date of Patent: Dec. 11, 2018

(54) HOLLOW RF FEED WITH COAXIAL DC POWER FEED

(71) Applicant: Lam Research Corporation, Fremont, CA (US)

(72) Inventors: Jason Augustino, Livermore, CA (US); John Drewery, San Jose, CA (US); Alex Paterson, San Jose, CA (US); Neil Benjamin, Palo Alto, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 346 days.

(21) Appl. No.: 14/817,372

(22) Filed: Aug. 4, 2015

(65) Prior Publication Data

US 2017/0040148 A1 Feb. 9, 2017

(51) Int. Cl.
*H01J 37/32* (2006.01)
*H01P 3/06* (2006.01)

(52) U.S. Cl.
CPC .. *H01J 37/32596* (2013.01); *H01J 37/32082* (2013.01); *H01J 37/32559* (2013.01); *H01J 37/32568* (2013.01); *H01J 37/32577* (2013.01); *H01P 3/06* (2013.01)

(58) Field of Classification Search
None
See application file for complete search history.

(56) References Cited

U.S. PATENT DOCUMENTS

| | | | | |
|---|---|---|---|---|
| 8,398,815 B2* | 3/2013 | Yamazawa | ........ | H01J 37/32091 118/723 E |
| 8,898,889 B2* | 12/2014 | Nam | ................. | H01J 37/32577 204/298.02 |
| 9,401,264 B2* | 7/2016 | Marakhtanov | .... | H01J 37/32183 |
| 9,520,276 B2* | 12/2016 | Takahashi | ......... | H01J 37/32009 |
| 2006/0066247 A1* | 3/2006 | Koshiishi | .......... | H01J 37/32018 315/111.21 |
| 2009/0081811 A1* | 3/2009 | Benjamin | ......... | H01J 37/32045 438/5 |
| 2009/0118872 A1* | 5/2009 | Nonaka | .............. | G05D 23/1934 700/285 |
| 2009/0126634 A1* | 5/2009 | Yamazawa | .......... | C23C 16/5096 118/723 R |
| 2010/0182107 A1* | 7/2010 | Margomenos | ......... | H01P 3/026 333/246 |
| 2012/0097332 A1* | 4/2012 | Lin | .................... | H01J 37/32532 156/345.54 |
| 2012/0247678 A1* | 10/2012 | Takahashi | ......... | H01J 37/32009 156/345.44 |
| 2013/0127124 A1* | 5/2013 | Nam | ................. | H01J 37/32577 279/128 |
| 2013/0128409 A1* | 5/2013 | Nam | ................... | H01L 21/6831 361/234 |

(Continued)

*Primary Examiner* — Douglas W Owens
*Assistant Examiner* — Srinivas Sathiraju

(57) ABSTRACT

A feed tube for a substrate processing system includes an outer tube and a feed rod. The feed rod is arranged within the outer tube. The feed rod is arranged to provide radio frequency power to the substrate processing system and the outer tube provides a return for the radio frequency power. At least one conductor is routed within the feed rod. The conductor is arranged to provide electrical power to at least one component of the substrate processing system separate from the radio frequency power provided by the feed rod.

12 Claims, 7 Drawing Sheets

(56) References Cited

U.S. PATENT DOCUMENTS

| | | | |
|---|---|---|---|
| 2015/0091440 A1* | 4/2015 | Marakhtanov .... | H01J 37/32183 315/111.21 |
| 2016/0126067 A1* | 5/2016 | Okunishi ......... | H01J 37/32091 156/345.29 |
| 2016/0307738 A1* | 10/2016 | Marakhtanov .... | H01J 37/32183 |

* cited by examiner

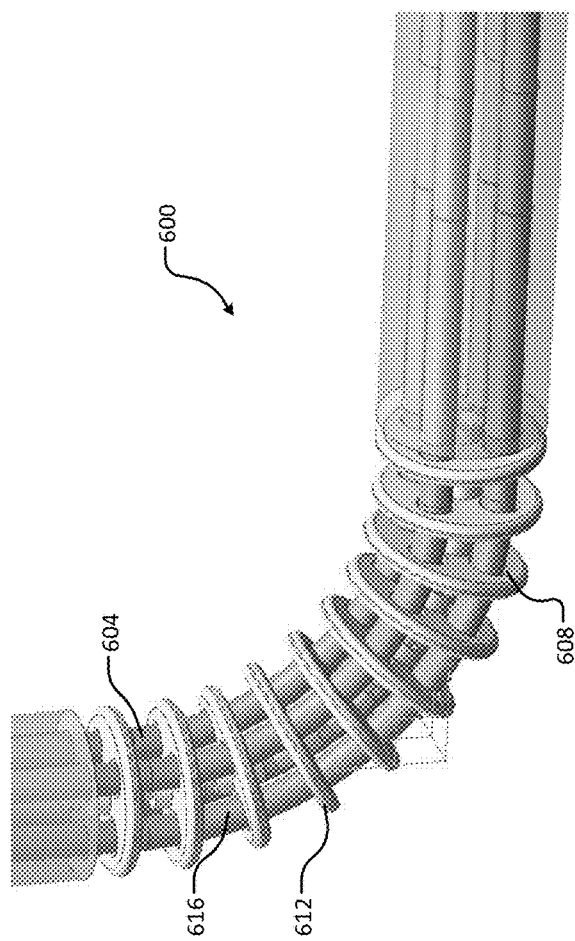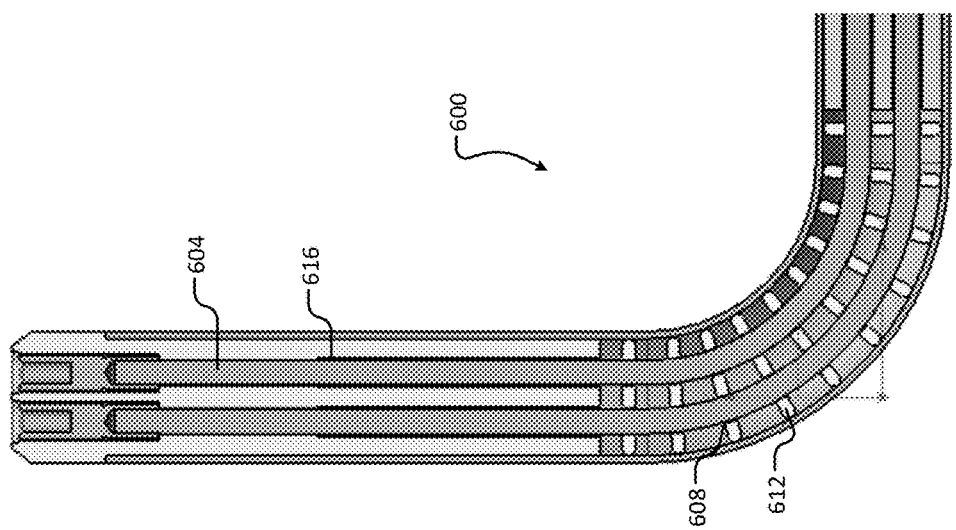

HOLLOW RF FEED WITH COAXIAL DC POWER FEED

FIELD

The present disclosure relates to substrate processing systems and methods, and more particularly implementations of a hollow RF feed tube of a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, a sputtering physical vapor deposition (PVD) process, an ion implantation process, and/or other etch (e.g., chemical etch, plasma etch, reactive ion etch, etc.), deposition, and cleaning processes.

A substrate may be arranged on a substrate support, such as a pedestal, an electrostatic chuck (ESC), etc. in a processing chamber of the substrate processing system. For example, during etching, a gas mixture including one or more precursors is introduced into the processing chamber and plasma is struck to etch the substrate. An RF feed (e.g., a hollow RF feed tube) provides RF power to the substrate support. For example, the RF feed is connected to a baseplate or other conductive portion of the substrate support.

SUMMARY

A feed tube for a substrate processing system includes an outer tube and a feed rod. The feed rod is arranged within the outer tube. The feed rod is arranged to provide radio frequency power to the substrate processing system and the outer tube provides a return for the radio frequency power. At least one conductor is routed within the feed rod. The conductor is arranged to provide electrical power to at least one component of the substrate processing system separate from the radio frequency power provided by the feed rod.

A method for providing electrical power to a substrate processing system includes providing radio frequency (RF) power to the substrate processing system using a feed rod arranged within an outer tube of a feed tube, providing a return for the RF power using the outer tube, routing at least one conductor through the feed rod to the substrate processing system, and providing, using the at least one conductor, electrical power to at least one component of the substrate processing system separate from the RF power provided by the feed rod.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 6A and 6B illustrate another example implementation of an RF feed rod according to the principles of the present disclosure.

In the drawings, reference numbers may be reused to identify similar and/or identical elements.

DETAILED DESCRIPTION

In substrate processing systems, various electrical and mechanical components are connected to a substrate support. For example, a hollow RF feed tube may be connected to a bottom portion of the substrate support to provide DC power. Other components connected to the substrate support include, but are not limited to, conductors (e.g., wires) for providing DC power to the substrate support (e.g., to heat the substrate support). The conductors may cause asymmetric RF power behavior (i.e., may disrupt coaxial RF symmetry), which may vary between processing chambers of different substrate processing systems.

In substrate processing systems and methods according to the principles of the present disclosure, a hollow RF feed tube is connected to a bottom portion of the substrate support. Conductors for providing DC power are routed through an RF feed rod of a hollow RF feed tube and connected to the bottom portion of the wafer processing system. The conductors may be supported and maintained, with a uniform spacing between the conductors, within the RF feed rod by various insulator components. Accordingly, the conductors allow DC power to be provided with repeatable wire positioning without disrupting the coaxial RF symmetry of the RF feed tube.

Figure 1:
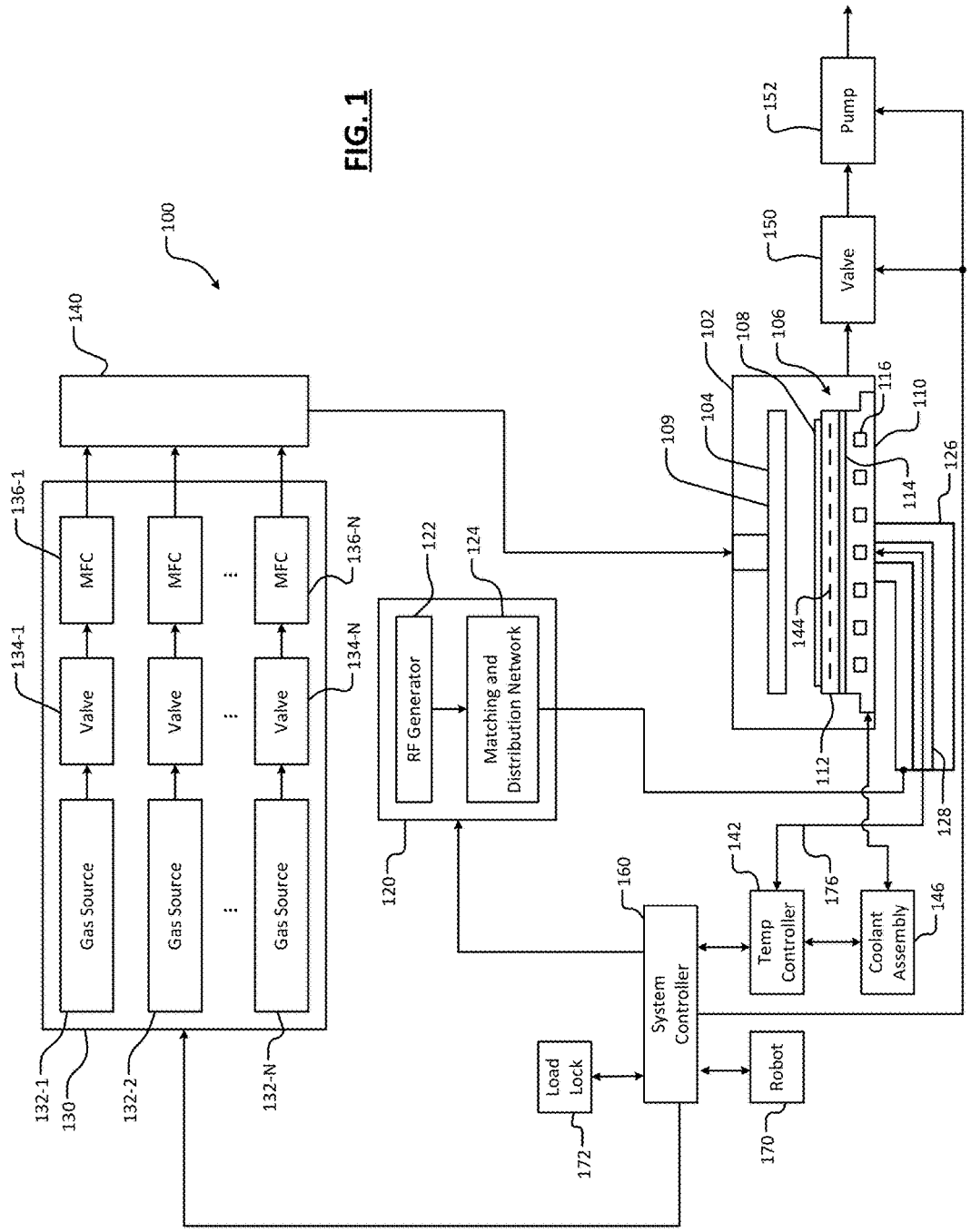
FIG. 1 is an example substrate processing system including a hollow RF feed tube according to the principles of the present disclosure.

Referring now to FIG. 1, an example substrate processing system 100 for performing etching using RF plasma is shown. The substrate processing system 100 includes a processing chamber 102 that encloses other components of the substrate processing chamber 100 and contains the RF plasma. The substrate processing chamber 100 includes an upper electrode 104 and an electrostatic chuck (ESC) 106. During operation, a substrate 108 is arranged on the ESC 106.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The ESC 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the ESC 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. As implemented in the substrate processing system 100 according to the principles of the present disclosure, the RF voltage is provided to the baseplate 100 via a hollow RF feed tube 126 and RF feed rod 128, shown schematically.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate. The temperature controller 142 may be used to control the plurality of TCEs 144 to control a temperature of the ESC 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the ESC 106.

A valve 150 and pump 152 may be used to evacuate reactants from the processing chamber 102. A system controller 160 may be used to control components of the substrate processing system 100. A robot 170 may be used to deliver substrates onto, and remove substrates from, the ESC 106. For example, the robot 170 may transfer substrates between the ESC 106 and a load lock 172.

In the systems and methods of the present disclosure, one or more conductors 176 is routed through the RF feed rod 128 of the hollow RF feed tube 126. For example only, the conductors 176 correspond to wires providing DC power to the ESC 106 (e.g., as shown, DC power provided by the temperature controller 142 for heating the ESC 106). Implementations of conductors routed through the hollow RF feed tube 126 are described below in more detail in various examples.

Figure 2:
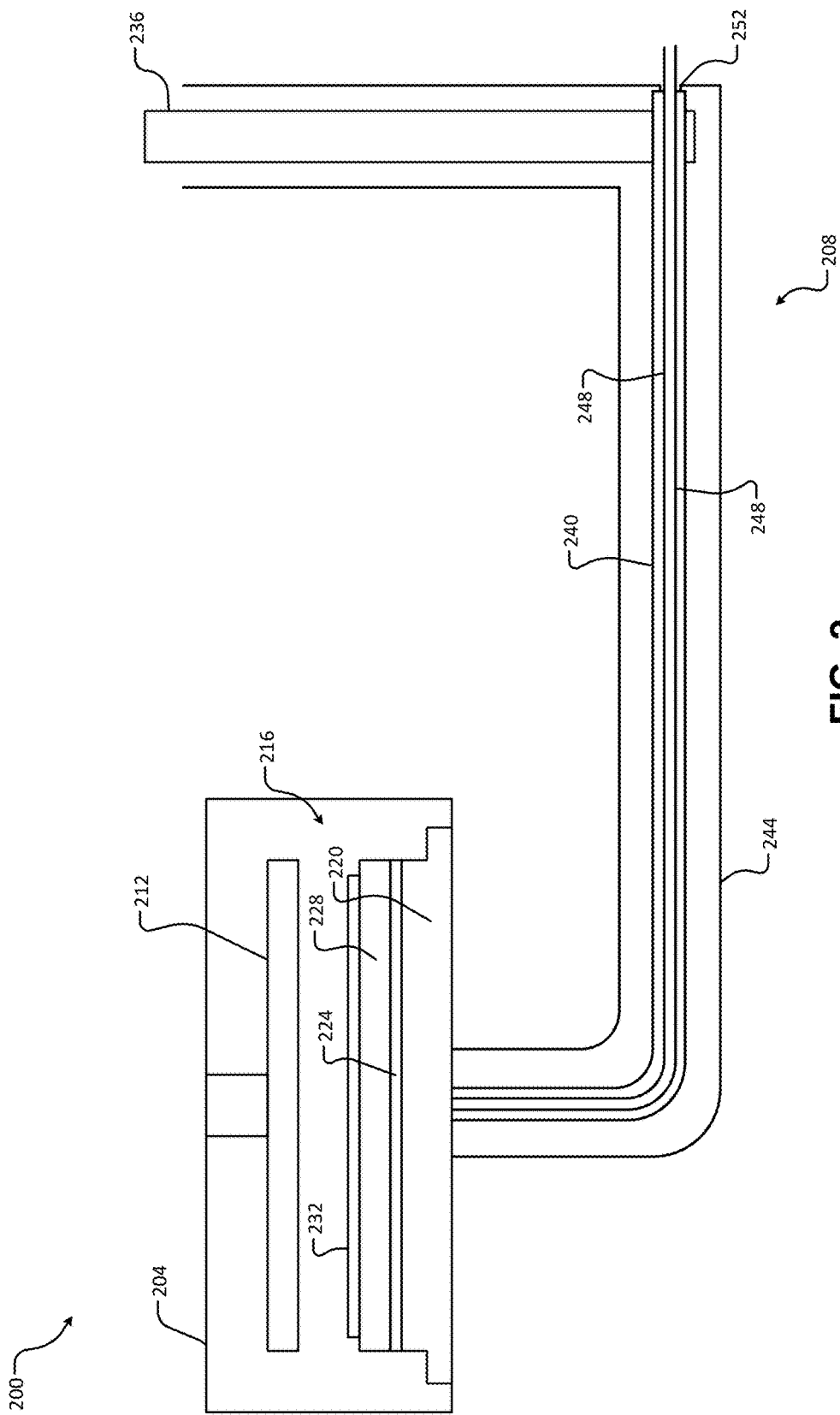
FIG. 2 is a simplified example substrate processing system including only a processing chamber and a hollow RF feed tube according to the principles of the present disclosure.

Referring now to FIG. 2, a simplified example substrate processing system 200 including only a processing chamber 204 and a hollow RF feed tube 208 according to the principles of the present disclosure is shown. The processing chamber 204 includes an upper electrode 212 and an ESC 216 (e.g., including conductive baseplate 220, thermal resistance layer 224, and heating plate 228) supporting a substrate 232.

The hollow RF feed tube 208 provides RF power (received, for example only, via vertical RF feed tube 236) to the baseplate 220. For example, the RF power is input via RF feed rod 240. An outer tube 244 provides a return for the RF power. Conductors 248. One or more conductors 248 are routed through the RF feed rod 240 of the hollow RF feed tube 208 and electrically connected to baseplate 220 (e.g., for providing DC power to the baseplate 220 and/or other components of the ESC 216). For example, the conductors 248 a routed through an opening 252 in the hollow RF feed tube 208.

Figure 3A:
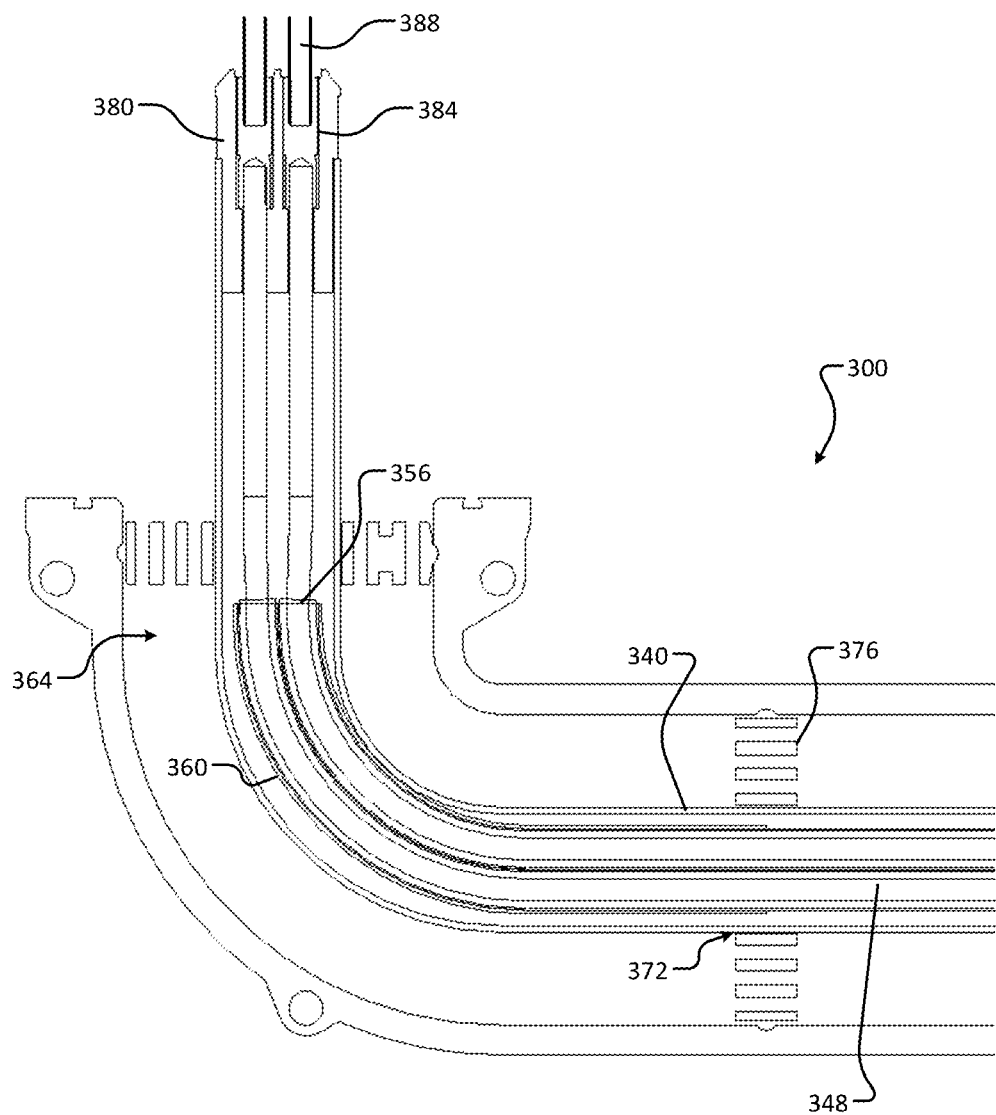
FIGS. 3A and 3B illustrate an example implementation of a hollow RF feed tube including an RF feed rod according to the principles of the present disclosure.
Figure 3B:
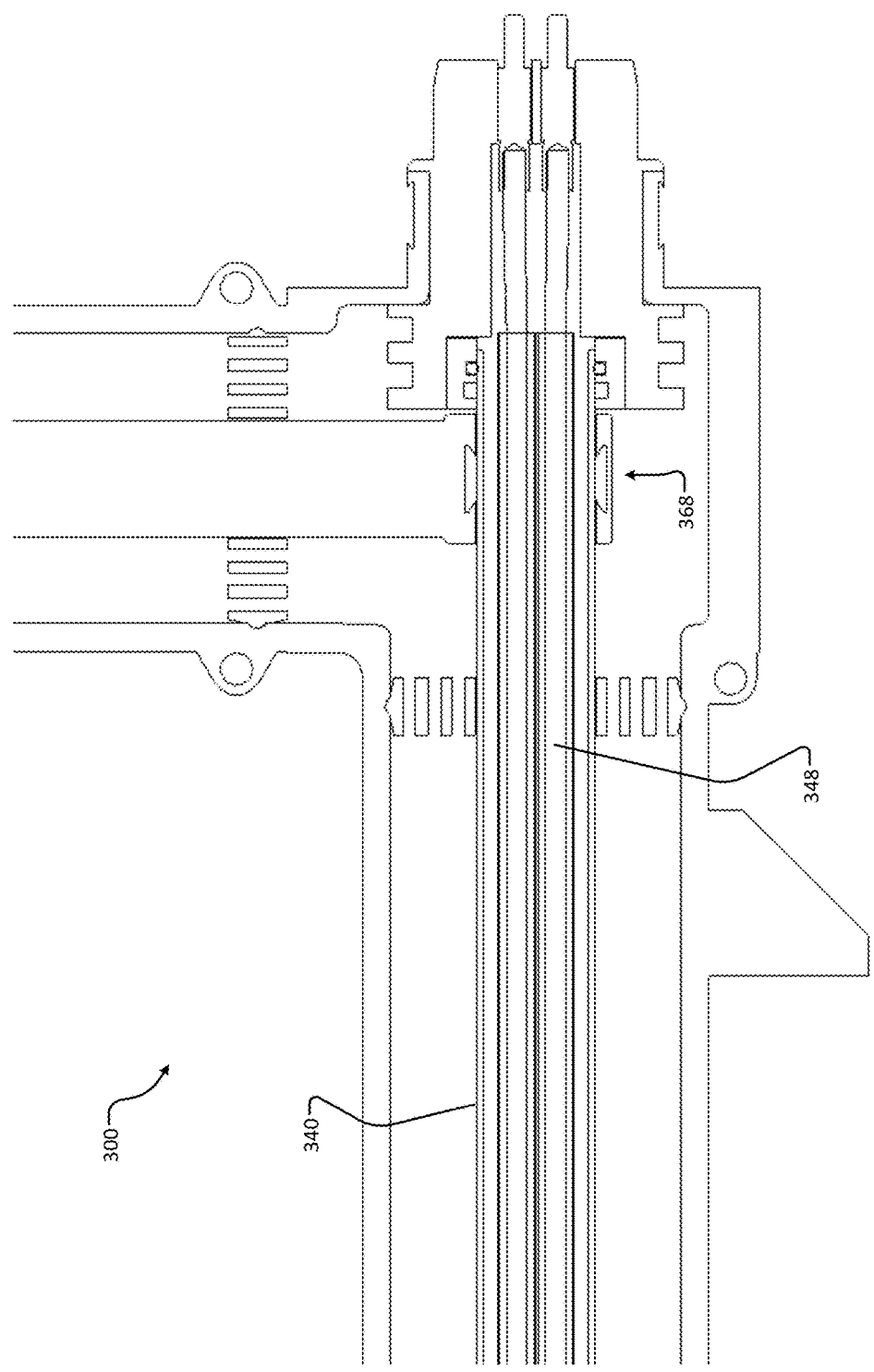

Referring now to FIGS. 3A and 3B, an example implementation of a hollow RF feed tube 308 including an RF feed rod 340 according to the principles of the present disclosure is shown. One or more conductors 348 are routed through the RF feed rod 340. Each of the conductors 348 may be individually encased within insulator material (e.g., comprised of a dielectric and insulative material) 356. The conductors 348 may be collectively encased within insulator material 360. The insulator material 360 may be the same as or different from the insulator material 356. For example only, the insulator material 356 and 360 may correspond to dielectric shrink tubing (e.g., silicon rubber shrink tubing, polyolefin, polypropylene, fluorinated ethylene propylene, polyvinylidene fluoride, etc.). The insulative material 360 may extend from a first end 364 to a second end 368 of the hollow RF feed tube 308, or may terminate at an intermediate position (e.g., 372 as shown) within the hollow RF feed tube. Disc standoffs 376 may be provided to maintain the RF feed rod 340 in a desired position (e.g., centered) within the hollow RF feed tube 308.

The conductors 348 may be insertably attached within a socket assembly 380. The socket assembly 380 may extend out of the RF feed rod 340. The socket assembly 380 may comprise polyethylene or another dielectric, insulative material. The socket assembly 380 includes embedded socket connectors 384 configured to receive respective ones of the conductors 348. The socket connectors 384, which are conductive, are electrically connected to the conductors 348. The socket connectors 384 are also electrically connected to power wires 388 of an ESC (e.g., a baseplate of the ESC as described in FIGS. 1-2). For example only, the power wires 388 may be soldered within the socket connectors 384. Accordingly, the socket assembly 380 provides an interface for electrically connecting the conductors 348 to the baseplate of an ESC or other substrate support.

Figure 4:
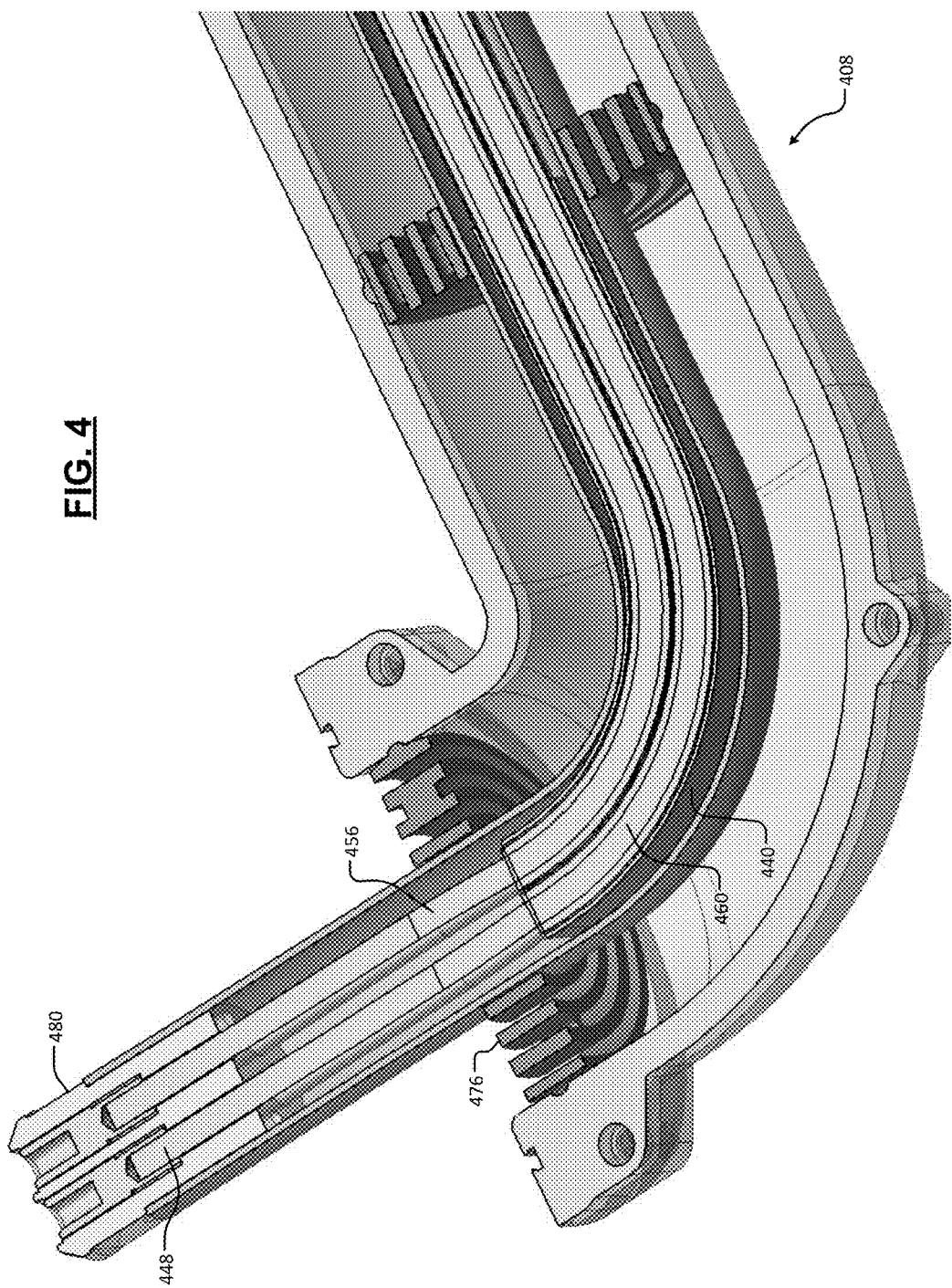
FIG. 4 is an example cross-section of a hollow RF feed tube according to the principles of the present disclosure.

Referring now to FIG. 4, an example cross-section of a hollow RF feed tube 408 according to the principles of the present disclosure is shown. The hollow RF feed tube 408 includes an RF feed rod 440 having one or more conductors 448 routed therein. The conductors 448 are individually encased in insulator material 456, and the conductors 448 are collectively encased within insulator material 460. The hollow RF feed tube 408 may include disc standoffs 476 as described above. The conductors 448 are connected, within socket assembly 480, to socket connectors 484.

Figure 5:
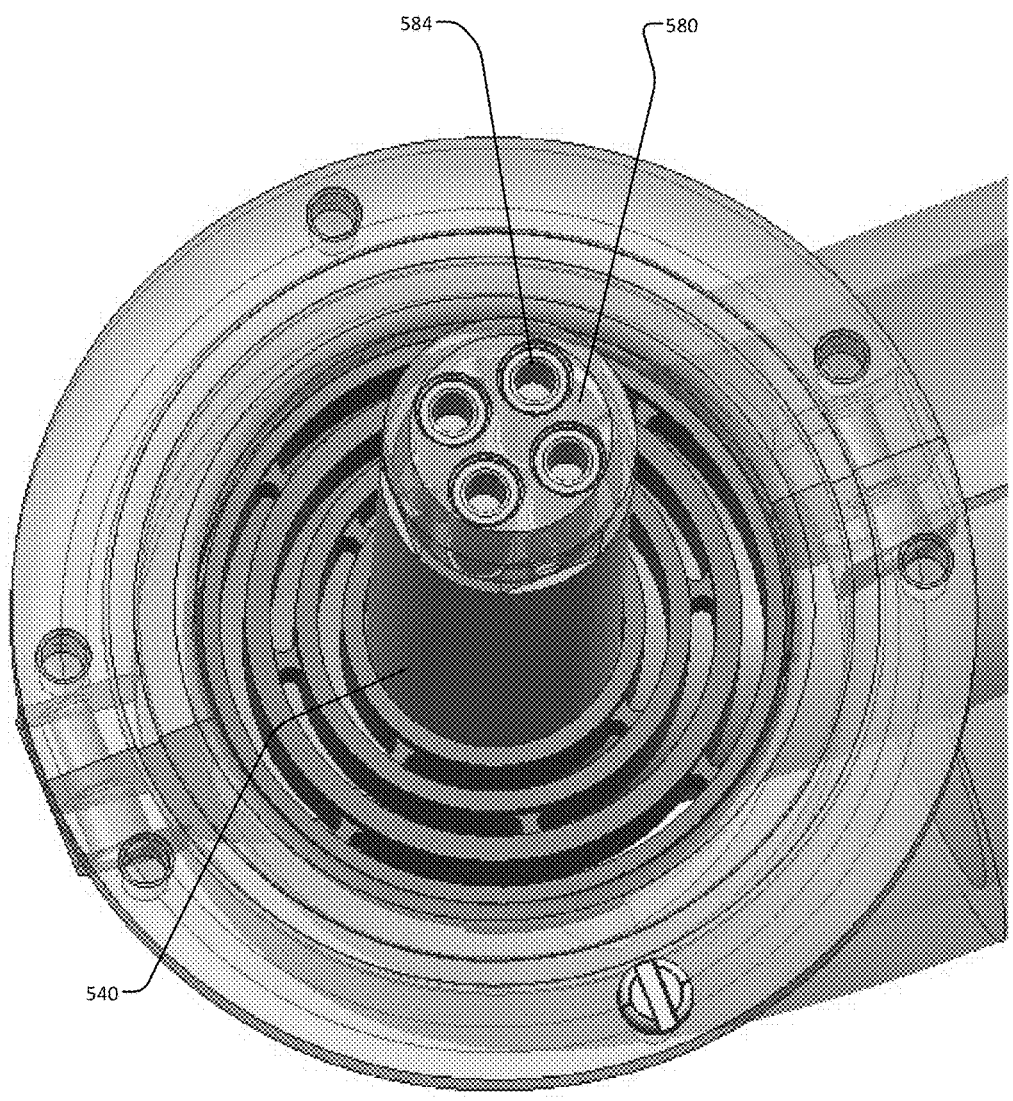
FIG. 5 is an example perspective view of a hollow RF feed tube according to the principles of the present disclosure.

Referring now to FIG. 5, an example perspective view of a hollow RF feed tube 508 is shown. Socket assembly 580, including socket connectors 584, extends from within RF feed rod 540 for electrical connection to DC power wires (not shown) of a baseplate of an ESC.

Referring now to FIGS. 6A and 6B, another example implementation of an RF feed rod 600 having one or more conductors 604 routed therein is shown. Each of the conductors 604 is retained within respective openings 608 in a plurality of inserts 612. The inserts 612, which may be disc-shaped, are arranged throughout the RF feed rod 600 for supporting the conductors 604 therein. Each of the conductors 604 may also be individually encased in an insulator material 616 as described above in FIG. 3. The conductors 604 may be routed through the inserts 612, within the RF feed rod 600, prior to bending the RF feed rod 600. For example, the RF feed rod 600 may comprise a straight section of copper tubing with the inserts 612 arranged therein. The conductors 604 are routed through the inserts 612 and then the RF feed rod 600 is bent into the configuration shown in FIGS. 6A and 6B. The inserts 612 maintain the conductors 604 in respective desired positions throughout the RF feed rod 600 while the RF feed rod 600 is bent into the desired configuration.

Although, as shown in the above examples, various implementations illustrate four conductors routed through an RF feed rod, other examples may include more or less than four conductors routed through the RF feed rod.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A feed tube for a substrate processing system, the feed tube comprising:
   an outer tube;
   a feed rod arranged within the outer tube, wherein the feed rod is arranged to provide radio frequency (RF) power to the substrate processing system and the outer tube provides a return for the RF power;
   a plurality of conductors routed within the feed rod, wherein the plurality of conductors is arranged to provide electrical power to at least one component of the substrate processing system separate from the RF power provided by the feed rod, wherein
      the feed rod is connected to a baseplate of a substrate support and the outer tube is connected to a lower portion of a processing chamber including the substrate support, and
      the outer tube and the feed rod each include at least one bend such that the plurality of conductors is (i) routed through the feed rod within the outer tube in a lateral direction and (ii) routed through the at least one bend toward the baseplate of the substrate support in an upward direction; and
   a socket assembly connected to the plurality of conductors and to wiring of the substrate processing system,
      wherein the wiring is connected to a heating plate.

2. The feed tube of claim 1, wherein the feed tube corresponds to a hollow RF feed tube.

3. The feed tube of claim 1, wherein each of the plurality of conductors is encased within an insulator material.

4. The feed tube of claim 1, wherein the plurality of conductors comprises a first conductor and a second conductor.

5. The feed tube of claim 4, wherein the first conductor is encased within a first insulator material, the second conductor is encased within a second insulator material, and the first conductor, the first insulator material, the second conductor, and the second insulator material are encased within a third insulator material.

6. The feed tube of claim 1, further comprising:
   a plurality of disc inserts arranged within the feed rod, wherein the plurality of conductors is routed through respective openings in the plurality of disc inserts.

7. A method for providing electrical power to a substrate processing system, the method comprising:
   using a feed rod arranged within an outer tube of a feed tube, providing radio frequency (RF) power to the substrate processing system;
   providing a return for the RF power using the outer tube, wherein the feed rod is connected to a baseplate of a substrate support and the outer tube is connected to a lower portion of a processing chamber including the substrate support, and wherein the outer tube and the feed rod each include at least one bend;
   routing a plurality of conductors through the feed rod to the substrate processing system, wherein routing the plurality of conductors includes (i) routing the plurality of conductors through the feed rod within the outer tube in a lateral direction and (ii) routing the plurality of conductors through the at least one bend toward the baseplate of the substrate support in an upward direction;
   providing, using the plurality of conductors, electrical power to at least one component of the substrate processing system separate from the RF power provided by the feed rod;
   connecting the plurality of conductors to wiring of the substrate processing system using a socket assembly; and
   connecting the wiring to a heating plate.

8. The method of claim 7, wherein the feed tube corresponds to a hollow RF feed tube.

9. The method of claim 7, further comprising encasing each of the plurality of conductors within an insulator material.

10. The method of claim 7, wherein the plurality of conductors comprises a first conductor and a second conductor.

11. The method of claim 10, further comprising encasing the first conductor within a first insulator material, encasing the second conductor within a second insulator material, and encasing the first conductor, the first insulator material, the second conductor, and the second insulator material within a third insulator material.

12. The method of claim 7, further comprising arranging a plurality of disc inserts within the feed rod and routing the plurality of conductors through respective openings in the plurality of disc inserts.

* * * * *